(12) United States Patent
Hongo et al.

(10) Patent No.: US 10,680,415 B2
(45) Date of Patent: Jun. 9, 2020

(54) ESD PROTECTION DEVICE AND METHOD FOR MANUFACTURING THE SAME

(71) Applicant: Murata Manufacturing Co., Ltd., Nagaokakyo-shi, Kyoto-fu (JP)

(72) Inventors: Hiromitsu Hongo, Nagaokakyo (JP); Takahiro Sumi, Nagaokakyo (JP); Takeshi Miki, Nagaokakyo (JP); Jun Adachi, Nagaokakyo (JP); Takayuki Tsukizawa, Nagaokakyo (JP); Takashi Noma, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 151 days.

(21) Appl. No.: 16/055,192

(22) Filed: Aug. 6, 2018

(65) Prior Publication Data

US 2018/0351330 A1    Dec. 6, 2018

Related U.S. Application Data

(63) Continuation of application No. PCT/JP2016/088361, filed on Dec. 22, 2016.

(30) Foreign Application Priority Data

Apr. 13, 2016 (JP) .................... 2016-080420

(51) Int. Cl.
   *H01T 1/20*    (2006.01)
   *H01T 2/02*    (2006.01)
   (Continued)

(52) U.S. Cl.
   CPC ............. *H01T 1/20* (2013.01); *H01L 23/60* (2013.01); *H01T 2/02* (2013.01); *H01T 4/10* (2013.01); *H01T 4/12* (2013.01); *H01T 21/00* (2013.01)

(58) Field of Classification Search
   USPC .................................. 361/117–120
   See application file for complete search history.

(56) References Cited

U.S. PATENT DOCUMENTS

| | | | |
|---|---|---|---|
| 2004/0201941 A1 | 10/2004 | Harris et al. | |
| 2014/0126102 A1* | 5/2014 | Sumi | H01T 4/12 361/220 |

(Continued)

FOREIGN PATENT DOCUMENTS

| | | |
|---|---|---|
| JP | 2005-184003 A | 7/2005 |
| JP | 2012-248328 A | 12/2012 |

(Continued)

OTHER PUBLICATIONS

Official Communication issued in International Patent Application No. PCT/JP2016/088361, dated Feb. 28, 2017.

*Primary Examiner* — Danny Nguyen
(74) *Attorney, Agent, or Firm* — Keating & Bennett, LLP

(57) ABSTRACT

An ESD protection device includes first and second discharge electrodes and a discharge auxiliary electrode that is electrically connected to the first and second discharge electrodes. The first and second discharge electrodes are located on or in an insulating substrate to at least partially face each other. The discharge auxiliary electrode includes first metal particles, second metal particles, and a binding agent. The first metal particles have a core-shell structure including a core section mainly including a first metal and a shell section which mainly includes an oxide of a second metal and which includes at least one portion with a cavity. The second metal particles have a core-shell structure including a core section mainly including the first metal and a shell section which mainly includes the oxide of the second metal and which has no cavity.

20 Claims, 4 Drawing Sheets

(51) Int. Cl.
*H01T 4/12* (2006.01)
*H01T 21/00* (2006.01)
*H01T 4/10* (2006.01)
*H01L 23/60* (2006.01)

(56) References Cited

U.S. PATENT DOCUMENTS

2014/0340812 A1   11/2014  Sumi et al.
2015/0155246 A1*  6/2015  Tsukizawa ................ H01T 1/22
                                                             361/220

FOREIGN PATENT DOCUMENTS

| JP | 2013-164946 A | 8/2013 |
| JP | 2014-082001 A | 5/2014 |
| JP | 5585744 B2 | 9/2014 |
| WO | 2013/129272 A1 | 9/2013 |

* cited by examiner

ESD PROTECTION DEVICE AND METHOD FOR MANUFACTURING THE SAME

CROSS REFERENCE TO RELATED APPLICATIONS

This application claims the benefit of priority to Japanese Patent Application No. 2016-080420 filed on Apr. 13, 2016 and is a Continuation Application of PCT Application No. PCT/JP2016/088361 filed on Dec. 22, 2016. The entire contents of each application are hereby incorporated herein by reference.

BACKGROUND OF THE INVENTION

1. Field of the Invention

The present disclosure relates to an ESD protection device and a method for manufacturing the same.

2. Description of the Related Art

ESD (electro-static discharge) is a phenomenon in which intense discharge occurs when an electrified conductive object (a human body or the like) comes in contact with or sufficiently approaches another conductive object (an electronic device or the like). ESD causes problems such as the damage and malfunction of electronic devices. ESD protection devices are used to prevent this and have a role in preventing the excessively high voltage generated during discharge from being applied to circuits of electronic devices.

For example, Japanese Patent No. 5585744 describes that a discharge auxiliary electrode of an ESD protection device includes clusters of multiple metal particles having a core-shell structure in which a cavity is present in at least one portion of a shell section. This enables reliability of insulating properties to be increased and also enables the discharge starting voltage to be reduced.

SUMMARY OF THE INVENTION

However, there is a need for ESD protection devices which maintain high reliability of insulating properties and which can further reduce the discharge starting voltage.

Therefore, preferred embodiments of the present invention provide ESD protection devices which achieve high reliability of insulating properties and further reduce discharge starting voltage.

An ESD protection device according to a preferred embodiment of the present invention includes a first discharge electrode, a second discharge electrode, and a discharge auxiliary electrode that is electrically connected to the first discharge electrode and the second discharge electrode, and the first discharge electrode and the second discharge electrode are located on or in an insulating substrate so as to at least partially face each other.

The discharge auxiliary electrode includes first metal particles, second metal particles, and a binding agent.

The first metal particles have a core-shell structure including a core section mainly including a first metal and a shell section which mainly includes an oxide of a second metal and which includes at least one portion having a cavity.

The second metal particles have a core-shell structure including a core section mainly including the first metal and a shell section which mainly includes the oxide of the second metal and which has no cavity.

According to the above preferred embodiment, an ESD protection device which has high reliability of insulating properties and which reduces the discharge starting voltage is provided.

In a preferred embodiment of an ESD protection device according to the present disclosure, the shell section of each of the first metal particles has a thickness of about 50 nm to about 1,500 nm, for example. This enables reliability of insulating properties and discharge characteristics to be further increased.

In another preferred embodiment of an ESD protection device according to the present disclosure, the shell section of each of the second metal particles has a thickness of about 1 nm to less than about 50 nm, for example. This allows an electric field to be readily concentrated and enables the discharge starting voltage to be further reduced.

In another preferred embodiment of an ESD protection device according to the present disclosure, the binding agent is a glassy matter-including substance. This enables reliability of insulating properties to be further increased by binding metal particles with the glassy matter-including substance.

In another preferred embodiment of an ESD protection device according to the present disclosure, the second metal is more oxidizable than the first metal. This enables core-shell-structured metal particles each including a shell section having sufficient thickness and uniformity to be produced.

In another preferred embodiment of an ESD protection device according to the present disclosure, the first metal is copper or a copper-based alloy mainly including copper. This enables ESD protection devices which are inexpensive and which further increase reliability of insulating properties to be provided.

In another preferred embodiment of an ESD protection device according to the present disclosure, the oxide of the second metal is at least one selected from the group consisting of aluminum oxide, silicon oxide, magnesium oxide, and nickel oxide. Since these metal oxides are highly insulating, reliability of insulating properties is further increased.

In another preferred embodiment of an ESD protection device according to the present disclosure, the core sections include the second metal in the form of a minor component. This enables reliability of insulating properties to be further increased.

In another preferred embodiment of an ESD protection device according to the present disclosure, the content of the second metal particles with respect to the whole metal particles is about 2% by volume to about 35% by volume. This enables reliability of insulating properties to be further increased and also enables the discharge starting voltage to be further reduced.

Another preferred embodiment of an ESD protection device according to the present disclosure further includes a first outer terminal electrode and a second outer terminal electrode electrically connected to the first discharge electrode and the second discharge electrode, respectively. The insulating substrate has a hollow section therein. The first discharge electrode and the second discharge electrode are located so as to at least partially face each other with the hollow section therebetween. The discharge auxiliary electrode is located such that at least one portion thereof is exposed to the hollow section. Since the insulating substrate includes the hollow section, the discharge starting voltage is further reduced.

A method for manufacturing an ESD protection device according to an aspect of the present disclosure is, a method for manufacturing an ESD protection device including a discharge auxiliary electrode that is electrically connected to a first discharge electrode and a second discharge electrode and includes: forming the discharge auxiliary electrode using a discharge auxiliary electrode paste including a first metal powder includes particles of an alloy of a first metal and a second metal that is more oxidizable than the first metal and a second metal powder including metal particles each including a shell section mainly including an oxide of the second metal and a core section, covered by the shell section, mainly including the first metal; firing the discharge auxiliary electrode; moving the second metal to the surfaces of the alloy particles; and oxidizing the moved second metal.

In accordance with the manufacturing method according to the above aspect, metal particles each including a shell section including a cavity are able to be formed from the first metal powder and metal particles each including a shell section with no cavity are able to be formed from the second metal powder. This enables ESD protection devices which have high reliability of insulating properties and which further reduce the discharge starting voltage to be provided.

In a preferred embodiment of a manufacturing method according to the present disclosure, the second metal powder is produced in such a manner that metal particles mainly including the first metal are coated with the oxide of the second metal by a mechanofusion process. This enables core-shell-structured metal particles each including a shell section with more uniform thickness to be produced.

In another preferred embodiment of a manufacturing method according to the present disclosure, the first metal powder is produced by an atomizing process. This enables an alloy with a relatively wide composition ratio to be produced at low cost and also enables discharge characteristics to be enhanced because a highly filled discharge auxiliary electrode is able to be formed.

In another aspect of a manufacturing method according to the present disclosure, an ESD protection device includes an insulating substrate and the first discharge electrode and the second discharge electrode are located so as to at least partially face each other.

A method includes preparing multiple ceramic green sheets including a first ceramic green sheet and a second ceramic green sheet; forming the discharge auxiliary electrode, the first discharge electrode, and the second discharge electrode on the first ceramic green sheet; forming a burnout layer such that the burnout layer covers a gap between the formed first and second discharge electrodes; stacking the second ceramic green sheet on the first ceramic green sheet such that the second ceramic green sheet covers the discharge auxiliary electrode, first discharge electrode, second discharge electrode, and burnout layer; forming a first outer terminal electrode and a second outer terminal electrode electrically connected to the first discharge electrode and the second discharge electrode, respectively, after stacking; and burning out the burnout layer such that a hollow section is formed in the insulating substrate. Forming the hollow section enables the discharge starting voltage to be further reduced.

According to the present disclosure, an ESD protection device which has high reliability of insulating properties and can further reduce the discharge starting voltage can be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present disclosure are described below in detail with reference to drawings.

Figure 1:
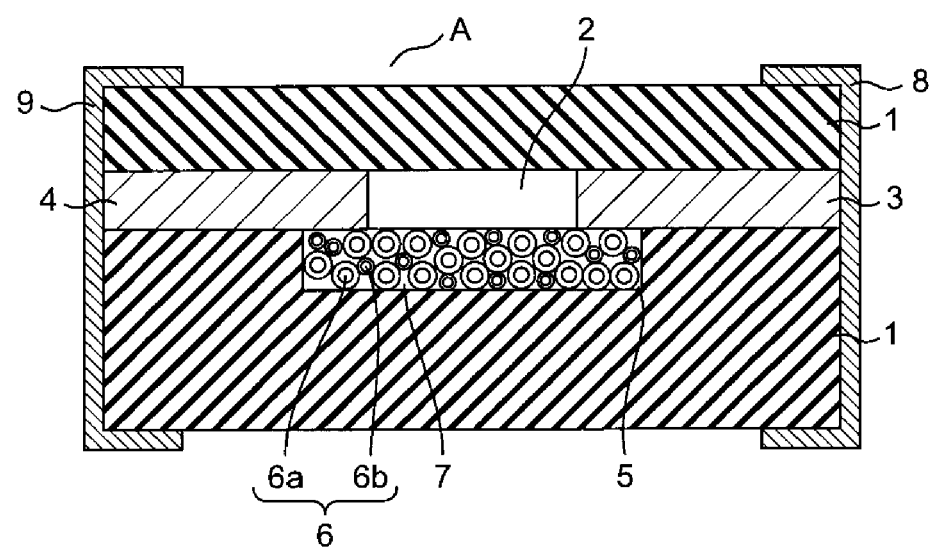
FIG. 1 is a schematic vertical sectional view showing an example of a structure of an ESD protection device according to a preferred embodiment of the present invention.

FIG. 1 is a schematic vertical sectional view showing an example of the structure of an ESD protection device according to this preferred embodiment. The ESD protection device A includes an insulating substrate 1 with a hollow section 2 provided therein, a first discharge electrode 3, a second discharge electrode 4, the first discharge electrode 3 and the second discharge electrode 4 located so as to at least partially face each other with the hollow section 2 therebetween, a discharge auxiliary electrode 5 which includes at least one portion exposed to the hollow section 2 and which is electrically connected to the first discharge electrode 3 and the second discharge electrode 4, a first outer terminal electrode 8, and a second outer terminal electrode 9, the first outer terminal electrode 8 and the second outer terminal electrode 9 being separately placed on an outer surface of the insulating substrate 1. The first outer terminal electrode 8 is electrically connected to the first discharge electrode 3 and the second outer terminal electrode 9 is electrically connected to the second discharge electrode 4. The discharge auxiliary electrode 5 includes a conductive material 6 and a binding agent 7 binding the conductive material 6. The conductive material 6 includes first metal particles 6a and second metal particles 6b.

Materials making up the insulating substrate 1 may be ceramic materials such as low temperature co-fired ceramics mainly including, for example, Ba×, Al, or Si. The insulating substrate 1 may include at least one of an alkali metal component and a boron component. The insulating substrate 1 may include a glass component.

The shape of each of the first discharge electrode 3 and the second discharge electrode 4 is not particularly limited and may be, for example, a strip shape. The first discharge electrode 3 and the second discharge electrode 4 may be made of, for example, a material such as Cu, Ag, Pd, Pt, Al, Ni, W, or an alloy including at least one thereof.

The discharge auxiliary electrode 5 includes at least one portion exposed to the hollow section 2 and is electrically connected to the first discharge electrode 3 and the second discharge electrode 4. The discharge auxiliary electrode 5 includes the conductive material 6 and the binding agent 7, which binds the conductive material 6. The conductive material 6 includes the first metal particles 6a and the second metal particles 6b. The first metal particles 6a include a core-shell structure including a core section mainly including a first metal and a shell section which mainly includes an oxide of a second metal and which includes at least one portion including a cavity. The second metal particles 6b have a core-shell structure including a core section mainly including the first metal and a shell section which mainly includes the oxide of the second metal and which has no cavity.

Figure 2:
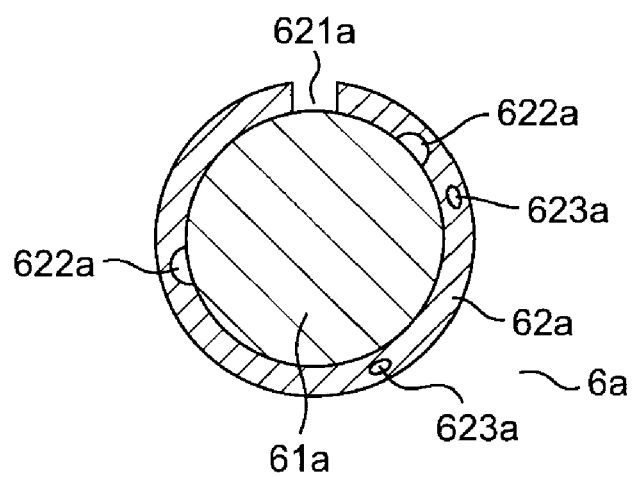
FIG. 2 is a schematic sectional view showing an example of the structure of a first metal particle included in a discharge auxiliary electrode of the ESD protection device shown in FIG. 1.

A core-shell structure is described with reference to FIG. 2 which is a schematic sectional view of a first metal particle. The first metal particle 6a includes a core section 61a and a shell section 62a. In a preferred embodiment of the present invention, the surface of the core section 61a may have a slight uncovered portion 621a not covered by the shell section 62a unless reliability of insulating properties is substantially impaired.

Furthermore, the term "cavity in a shell section" refers to a metal oxide-free portion in a shell section and includes a non-contact section 622a between the core section 61a and the shell section 62a and cavities 623a in the shell section 62a. At least one portion of the shell section of the first metal particle includes one or both of the non-contact section 622a and the cavities 623a. On the other hand, in each second metal particle, none of the non-contact section 622a and the cavities 623a is present in the shell section. Herein, the presence or absence of a cavity in a shell section is able to be confirmed by STEM (scanning transmission electron microscope) observation. Also, the expression "no cavity is present in a shell section" means that the number of cavities with a maximum width of about 10 nm or more in a shell section is one or less as determined by observing cross sections of 100 metal particles in a photograph obtained by STEM observation, for example.

As examples of the first metal included in each core section, copper, silver, aluminum, molybdenum, tungsten, and alloys thereof can be used. The first metal is preferably copper or a copper-based alloy mainly including copper. This is because copper and the copper alloy are inexpensive and further increase reliability of insulating properties.

As examples of the second metal defining a metal oxide included in each shell section, aluminum, nickel, bismuth, gallium, germanium, indium, magnesium, phosphorus, silicon, tin, and the like can be used.

The second metal is preferably more oxidizable than the first metal. This enables core-shell-structured metal particles each including a shell section with sufficient thickness and uniformity to be produced. For example, when the first metal used is copper, the second metal used is preferably aluminum.

In particular, the oxide of the second metal is preferably at least one selected from the group consisting of aluminum oxide, silicon oxide, magnesium oxide, and nickel oxide. This is because these oxides have high insulating properties and therefore increase insulating reliability during discharge.

The core section may include the second metal in addition to the first metal. This is because the thickness of the shell section, which is formed using the oxide of the second metal, is able to be controlled by varying the ratio between the first metal and the second metal and therefore reliability of insulating properties is further increased. For example, when the first metal used is copper, the second metal used is preferably aluminum.

The first metal used is preferably copper or a copper-based metal. In the case where the discharge auxiliary electrode 5 is co-fired with the insulating substrate 1, the insulating substrate 1 is preferably including LTCC.

The average size (for example, D50) of the second metal particles is preferably less than the average size of the first metal particles. This enables the content of the second metal particles in the discharge auxiliary electrode to be increased and also enables the discharge starting voltage to be further reduced with reliability of insulating properties ensured.

The shell section of each first metal particle preferably has a thickness of about 50 nm to about 1,500 nm, for example. This enables reliability of insulating properties and discharge characteristics to be further increased.

The thickness of the shell section of each second metal particle is preferably less than the thickness of the shell section of the first metal particle and is preferably, for example, about 1 nm to less than about 50 nm. This allows an electric field to be readily concentrated and enables the discharge starting voltage to be further reduced.

The content of the second metal particles with respect to the whole metal particles is about 2% by volume to about 35% by volume, preferably by about 2% by volume to about 25% by volume, and more preferably about 7% by volume to about 25% by volume, for example. This allows high reliability of insulating properties to be maintained and enables the discharge starting voltage to be further reduced.

The binding agent used may be a glassy matter-including substance. This is because binding the metal particles with the glassy matter-including substance enables reliability of insulating properties to be further increased. As examples of the glassy matter-including substance, silicate glasses such as $SiO_2$—$BaO$—$Al_2O_3$—$MnO_2$-based glass, $SiO_2$—$B_2O_3$—$CaO$-based glass, $SiO_2$—$B_2O_3$—$Li_2O$-based glass, and $SiO_2$—$B_2O_3$—$Al_2O_3$—$Li_2O$—$CaO$-based glass can be used.

For example, a material such as Cu, Ag, Pd, Pt, Al, Ni, W, or an alloy including at least one thereof can be used to form the first outer terminal electrode 8 and the second outer terminal electrode 9.

The discharge gap (the distance between a facing portion of a first discharge electrode and a facing portion of a second discharge electrode) of a conventional ESD protection device is about 10 μm to about 50 μm, for example. In a preferred embodiment of the present invention, a value of about 5 μm to about 20 μm, preferably a value of about 6 μm to about 13 μm, can be used.

In accordance with the ESD protection device according to this preferred embodiment, the shell section of each first metal particle includes a cavity and therefore the thickness of a cavity portion of the shell section is small; hence, the discharge starting voltage is able to be reduced. On the other hand, since the shell section includes the cavity, the cavity defines and functions as the origin of internal discharge during discharge in some cases and may possibly cause characteristics to deteriorate. Therefore, the second metal particles, which include the shell sections with no cavity, are included. This enables the amount of the metal particles to be increased with short circuiting between the metal particles being significantly reduced or prevented, and also enables the discharge starting voltage to be further reduced with high reliability of insulating properties ensured.

A method for manufacturing the ESD protection device according to this preferred embodiment is described below.

The method for manufacturing the ESD protection device according to this preferred embodiment is a method for manufacturing an ESD protection device including a discharge auxiliary electrode which is electrically connected to a first discharge electrode and a second discharge electrode and includes forming the discharge auxiliary electrode using a discharge auxiliary electrode paste including a first metal powder including particles of an alloy of the first metal and the second metal, which is more oxidizable than the first metal, and a second metal powder including metal particles each including a shell section mainly including an oxide of the second metal and a core section, covered by the shell section, mainly including the first metal; firing the discharge auxiliary electrode; moving the second metal to the surfaces of the alloy particles; and oxidizing the moved second metal.

In accordance with the exemplary manufacturing method, metal particles (which correspond to the first metal particles) each including a shell section including a cavity can be formed from the first metal powder and metal particles (which correspond to the second metal particles) each including a shell section with no cavity are able to be formed from the second metal powder. As described above, the ESD protection device is manufactured such that high reliability of insulating properties is ensured and the discharge starting voltage is further reduced.

An example of manufacturing the ESD protection device is described with reference to FIGS. 3A to 3F.

In order to form the discharge auxiliary electrode, the first metal powder, which includes the alloy particles including the first metal and the second metal more oxidizable than the first metal, is prepared. The first metal powder is able to be produced by an atomizing process. According to the atomizing process, the composition of an alloy is readily controlled. The average particle size of the first metal powder is about 0.1 µm to about 10 µm and is preferably about 2 µm to about 4 µm in terms of median diameter D50, for example. D50 can be determined by a laser diffraction particle size distribution method.

Next, the second metal powder, which includes the metal particles each including the shell section mainly including the oxide of the second metal and the core section, covered by the shell section, mainly including the first metal, is prepared. The second metal powder can be produced by, for example, a process in which metal particles serving as cores are coated with a metal oxide or a mechanofusion process. The average particle size of the second metal powder is about 0.1 µm to about 10 µm and is preferably about 0.5 µm to about 4 µm in terms of median diameter D50, for example.

The discharge auxiliary electrode paste is prepared by mixing the first metal particles, the second metal particles, the binding agent, and an organic vehicle at a predetermined ratio.

Next, multiple ceramic green sheets for forming the insulating substrate are prepared.

Figure 3A:
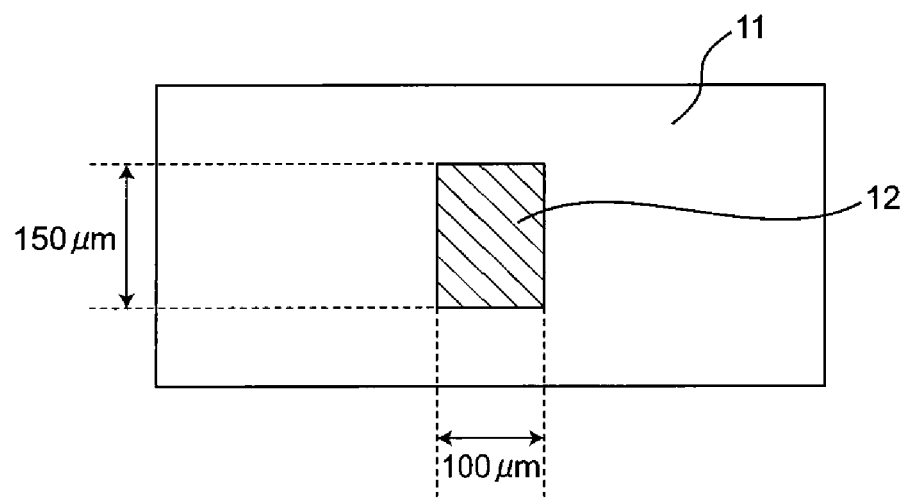
FIG. 3A is a schematic plan view showing an example of a step of a method for manufacturing an ESD protection device according to a preferred embodiment of the present invention.

Next, as shown in FIG. 3A, an unfired discharge auxiliary electrode 12 with a predetermined size is formed on a first ceramic green sheet 11 using the discharge auxiliary electrode paste.

Figure 3B:
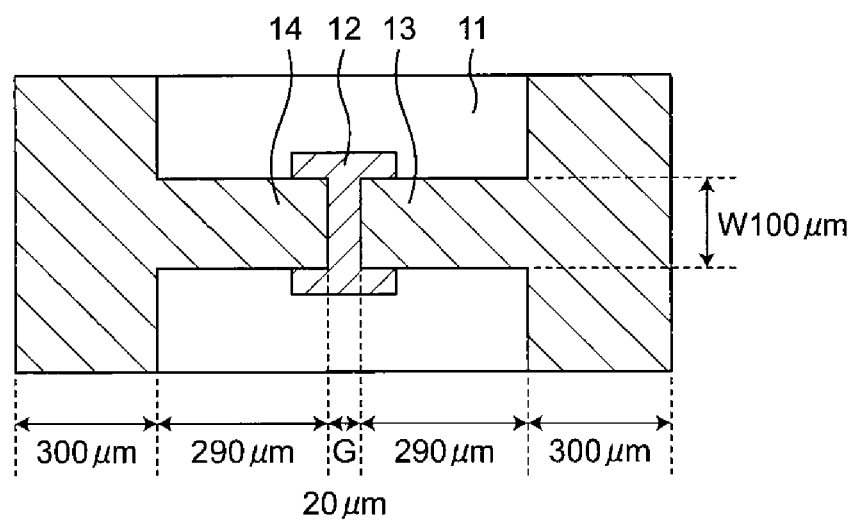
FIG. 3B is another schematic plan view showing an example of a step of a method for manufacturing an ESD protection device according to a preferred embodiment of the present invention.

Next, a discharge electrode paste is prepared using a metal powder for discharge electrodes and an organic vehicle. The discharge electrode paste is applied to the first ceramic green sheet 11 so as to at least partially overlap the unfired discharge auxiliary electrode 12, such that an unfired first discharge electrode 13 and an unfired second discharge electrode 14 are formed as shown in FIG. 3B. On the unfired discharge auxiliary electrode 12, the unfired first discharge electrode 13 and the unfired second discharge electrode 14 face each other with a predetermined gap G therebetween.

Figure 3C:
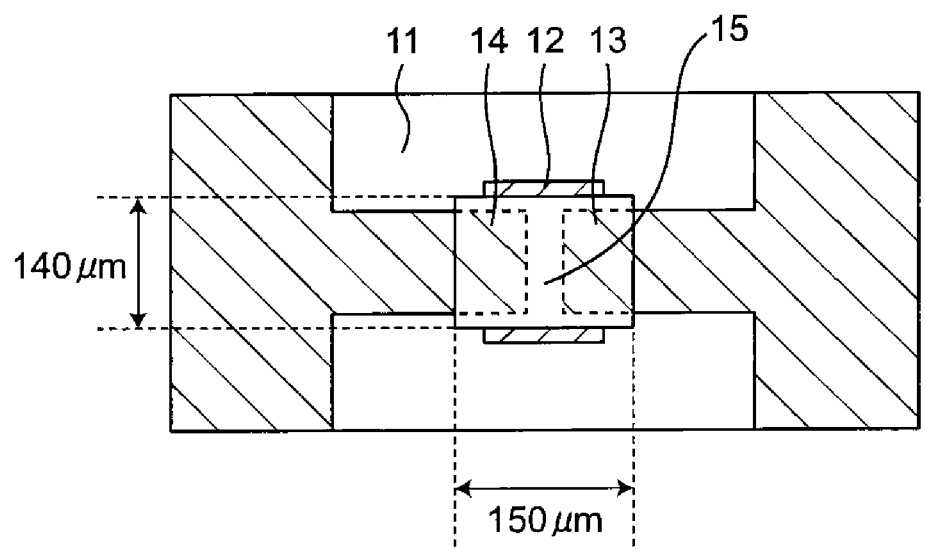
FIG. 3C is another schematic plan view showing an example of a step of a method for manufacturing an ESD protection device according to a preferred embodiment of the present invention.

Next, as shown in FIG. 3C, an unfired burnout layer 15 with a predetermined size is formed in such a manner that a resin bead paste for burnout layers is applied so as to cover the opposing gap G between the unfired first discharge electrode 13 and the unfired second discharge electrode 14. The unfired burnout layer 15 is burned out in a firing step below such that a hollow section 22 below remains in the insulating substrate.

Pastes for forming the first discharge electrode 13, the second discharge electrode 14, the discharge auxiliary electrode 12, and the burnout layer 15 may be directly applied to objects or may be indirectly applied to objects by a transfer process or the like.

Figure 3D:
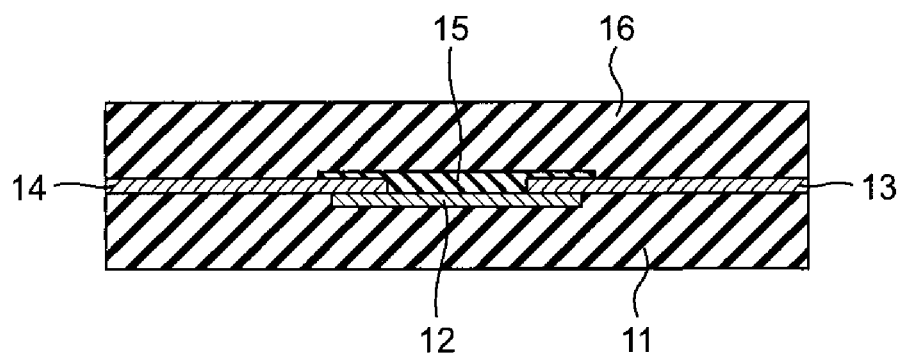
FIG. 3D is another schematic plan view showing an example of a step of a method for manufacturing an ESD protection device according to a preferred embodiment of the present invention.

Next, as shown in FIG. 3D, a second ceramic green sheet 16 uncoated with paste is stacked on the first ceramic green sheet 11, followed by pressure bonding, such that a green sheet laminate is obtained. Herein, the second ceramic green sheet 16 may be used in combination with one or more second ceramic green sheets 16.

Figure 3E:
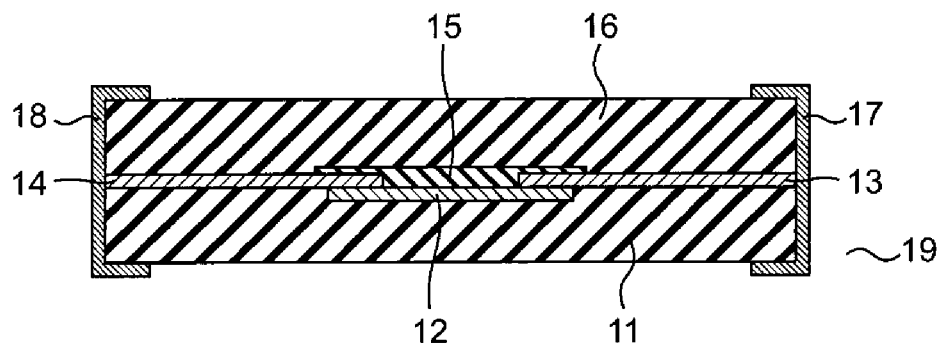
FIG. 3E is another schematic plan view showing an example of a step of a method for manufacturing an ESD protection device according to a preferred embodiment of the present invention.

Next, the green sheet laminate is cut to a predetermined size and an outer terminal electrode paste is applied to outer surfaces thereof, such that unfired outer terminal electrodes 17 and 18 to be connected to the unfired first discharge electrode 13 and the unfired second discharge electrode 14, respectively, are formed. In this manner, an unfired ESD protection device 19 shown in FIG. 3E is obtained.

Figure 3F:
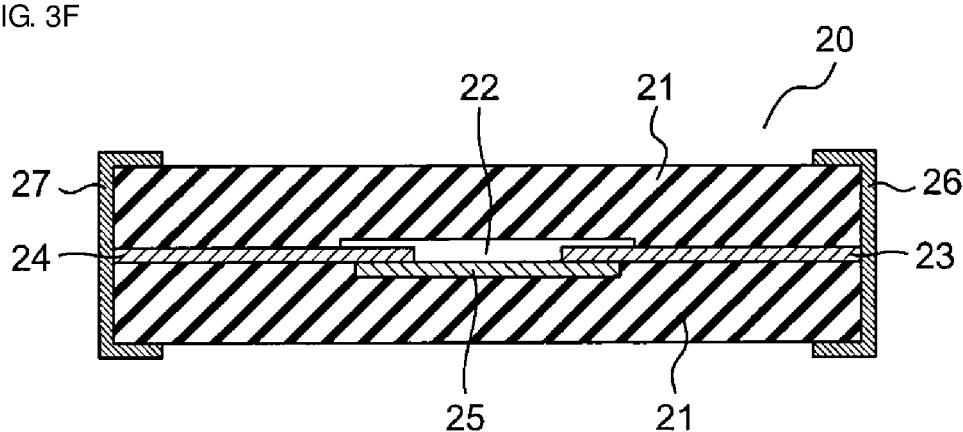
FIG. 3F is another schematic plan view showing an example of a step of a method for manufacturing an ESD protection device according to a preferred embodiment of the present invention.

Next, an ESD protection device 20 shown in FIG. 3F is obtained by firing. The ESD protection device 20 includes an insulating substrate 21 formed by sintering the first and second ceramic green sheets, a sintered first discharge electrode 23, a second discharge electrode 24, a discharge auxiliary electrode 25, and outer terminal electrodes 26 and 27. The burnout layer 15 is burned out, such that the hollow section 22 is formed in the insulating substrate 21.

In order to form a discharge auxiliary electrode, firing includes a "core-shell structure-forming step", a "core section-shell section junction-forming step" and a "cavity-in-shell section-forming step", for example. Each step is described below.

Core-Shell Structure-Forming Step

In this step, in metal particles of a first metal powder including particles of an alloy of a first metal and a second metal more oxidizable than the first metal, core sections mainly including the first metal are formed by moving the second metal toward the surfaces of the metal particles and shell sections made of the oxide of the second metal is formed in such a manner that the second metal is oxidized at the point in time when the second metal reaches the metal particle surfaces. The temperature in this step is not particularly limited and is preferably about 500° C. to about 900° C., for example. This is because at a temperature of less than about 500° C., the movement of the second metal to the surfaces of the alloy particles is slow and any shell section having sufficient thickness and uniformity cannot be formed in some cases and because at a temperature of more than about 900° C., the movement of metal to the alloy particle surfaces is nonuniform and any shell section having sufficient thickness and uniformity cannot be formed in some cases. The concentration of oxygen in this step needs to be set such that the first metal, which makes up the alloy particles, is not oxidized but the second metal is oxidized. The oxygen concentration is not particularly limited and may satisfy this condition. The oxygen concentration can be adjusted using, for example, an oxygen-including gas mixture such as an $H_2/H_2O/N_2$ gas mixture. In the case where the oxygen concentration is set such that the first metal is oxidized, the first metal itself is oxidized and the second metal is prevented from moving to the surfaces of the alloy particles; hence, any shell having sufficient thickness and uniformity cannot be formed. Alternatively, in the case where the oxygen concentration is set such that both of the first metal and the second metal are not oxidized, any shell having sufficient thickness and uniformity cannot be formed. The temperature-holding time in this step is preferably set to about 30 minutes to about 800 minutes within the range of about 500° C. to about 900° C., for example. This is because when the temperature-holding time is less than 30 minutes, the movement of the second metal to the alloy particle surfaces is insufficient and any shell having sufficient thickness and uniformity cannot be formed in some cases and because when the temperature-holding time is more than about 800 minutes, a significant reduction in productivity is caused in some cases.

Core Section-Shell Section-Joining Step

In this step, the core sections, which mainly include the first metal, are joined to the shell sections, which are made of the oxide of the second metal. The temperature in this step is not particularly limited and needs to be set to be lower than or equal to the melting point of the first metal. This is because when the temperature therein is higher than the melting point of the first metal, a core-shell structure is broken by the melting of the core section and therefore characteristics of the ESD protection device cannot be ensured. The concentration of oxygen in this step needs to be set such that the second metal is not reduced. The oxygen concentration is preferably set such that the first metal is not oxidized but the second metal is oxidized. This is because in the case where the second metal is reduced, the shell sections are broken and characteristics of the ESD protection device are deteriorated. In the case where the oxygen concentration is set such that the first metal is not oxidized or the second metal is not reduced, the core sections are joined to the shell sections, oxides in the shell sections are appropriately sintered, and the shell sections are likely to be formed so as to have a cavity in the subsequent cavity-in-shell section-forming step. The oxygen concentration can be adjusted using, for example, an oxygen-including gas mixture such as an $H_2/H_2O/N_2$ gas mixture. The temperature-holding time in this step is preferably set to about 10 minutes to about 300 minutes, for example. This is because when the temperature-holding time is less than about 10 minutes, the junctions of the core sections and the shell sections cannot be ensured in some cases and because when the temperature-holding time is more than about 300 minutes, metal oxides in the shell sections are excessively sintered and shells are unlikely to be formed so as to have a cavity in the subsequent cavity-in-shell section-forming step.

Cavity-in-Shell Section-Forming Step

In this step, the shell sections are formed so as to have a cavity. In this step, the core sections, which are made of metal, are shrunk more significantly than the shell sections, which mainly include an oxide. In this operation, only the shell sections joined to the core sections are shrunk in such a state that the shell sections are joined to the core sections, such that structural disorder is caused in the shell sections to form cavities in the shell sections. The temperature in this step is not particularly limited and may be lower than the temperature in the core section-shell section-joining step. The temperature in this step is preferably about 100° C. or more lower than the temperature in the core section-shell section-joining step. This is because when the temperature in this step is lower than about 100° C., the shrinkage of the core sections is small and any cavity with a sufficient size cannot be formed in some cases. The concentration of oxygen in this step needs to be set such that the second metal is not reduced. The oxygen concentration is preferably set such that the first metal is not oxidized but the second metal is oxidized. This is because in the case where oxygen concentration is set such that the second metal is reduced, the shell sections are broken and characteristics of the ESD protection device are deteriorated. It is not preferable that the oxygen concentration is set such that the first metal and the second metal are oxidized, because molecules of oxygen pass through the shell sections to oxidize the first metal and the shell sections are damaged by the oxidative expansion of the first metal in some cases. In the case where the oxygen concentration is set such that the first metal is not oxidized or the second metal is not reduced, the shell sections are likely to be formed so as to include the cavities. The oxygen concentration can be adjusted using, for example, an oxygen-including gas mixture such as an $H_2/H_2O/N_2$ gas mixture. The temperature-holding time in this step is preferably set to about 30 minutes or more. This is because when the temperature-holding time is less than about 30 minutes, cavities are unlikely to be formed in the shell sections.

In the above manufacturing example, the formation of the first discharge electrode, the second discharge electrode, and the discharge auxiliary electrode in the insulating substrate has been exemplified. However, the first discharge electrode, the second discharge electrode, and the discharge auxiliary electrode may be formed on a surface of the insulating substrate. In this case, the burnout layer is not necessary.

EXAMPLE

Preferred embodiments of the present invention are further described below in detail using an example. The present disclosure is not limited to the example below.

In this example, a first metal used was Cu as a second metal used was Al as described below. A starting material used to prepare first metal particles was a Cu—Al alloy prepared by an atomizing process. Second metal particles used were an alumina-coated copper powder obtained by coating a Cu powder, prepared by a wet synthesis process, with a nano-sized alumina powder by a mechanofusion process. The mechanofusion process was performed using a circulating mechanofusion system. Table 1 shows the composition and average particle size of the Cu—Al alloy used and the alumina-coated copper powder used. The average particle size used was the median diameter D50 determined by a laser diffraction particle size distribution method. The "amount of Al" and the "amount of alumina" were determined by an ICP-AES method (inductively coupled plasma atomic emission spectroscopy).

TABLE 1

| | Sample number | Composition | Average particle size (μm) | Amount of Al (weight percent) | Amount of alumina (weight percent) |
|---|---|---|---|---|---|
| First metal particles | M1-1 | CuAl | 2.5 | 7 | — |
| | M1-2 | CuAl | 2.5 | 5 | — |
| | M1-3 | CuAl | 2.5 | 11 | — |
| Second metal particles | M2-1 | Alumina-coated Cu | 0.7 | — | 0 |
| | M2-2 | Alumina-coated Cu | 0.7 | — | 1 |
| | M2-3 | Alumina-coated Cu | 0.7 | — | 3 |

TABLE 1-continued

| Sample number | Composition | Average particle size (μm) | Amount of Al (weight percent) | Amount of alumina (weight percent) |
|---|---|---|---|---|
| M2-4 | Alumina-coated Cu | 0.7 | — | 5 |

Table 2 shows the composition, average particle size, and specific surface area of an oxide powder used as a binding agent. Incidentally, the oxide powder has the same composition as that of a substrate component.

TABLE 2

| Binding agent Type number | Composition | Average particle size D50 (μm) | Specific surface area (m$^2$/g) |
|---|---|---|---|
| OX-1 | Ba—Si—Al—Mn based | 1.3 | 8 |

Table 3 shows the composition of an organic vehicle used to prepare pastes. The organic vehicle was obtained by dissolving an ETHOCEL resin with a weight-average molecular weight of about $5 \times 10^4$ and an alkyd resin with a weight-average molecular weight of about $8 \times 10^3$ in terpineol.

TABLE 3

| Organic vehicle | Composition (weight percent) | | |
|---|---|---|---|
| Composition number | ETHOCEL | Alkyd | Terpineol |
| OV-1 | 9.0 | 4.5 | 86.5 |

The first metal particles, the second metal particles, the binding agent, and the organic vehicle were mixed at ratios shown in Table 4, followed by dispersion using a triple roll, such that Discharge Auxiliary Electrode Pastes P-1 to P-10 were prepared.

TABLE 4

| Paste number | Composition (volume percent) | | | | | | | | | First metal particles/ second metal particles (volume percent) | First metal particles/ binding agent (volume percent) |
|---|---|---|---|---|---|---|---|---|---|---|---|
| | First metal particles | | | Second metal particles | | | | Binding agent | Vehicle | | |
| | M1-1 | M1-2 | M1-3 | M2-1 | M2-2 | M2-3 | M2-4 | OX-1 | OV-1 | | |
| P-1 | 11.0 | — | — | 1.0 | — | — | — | 3.0 | 85.0 | 92/8 | 82/18 |
| P-2 | 10.0 | — | — | 2.0 | — | — | — | 3.0 | 85.0 | 83/17 | 82/18 |
| P-3 | 11.0 | — | — | — | 1.0 | — | — | 3.0 | 85.0 | 92/8 | 82/18 |
| P-4 | 10.0 | — | — | — | 2.0 | — | — | 3.0 | 85.0 | 83/17 | 82/18 |
| P-5 | 11.0 | — | — | — | — | — | 1.0 | 3.0 | 85.0 | 92/8 | 82/18 |
| P-6 | — | 11.0 | — | 1.0 | — | — | — | 3.0 | 85.0 | 92/8 | 82/18 |
| P-7 | — | — | 11.0 | 1.0 | — | — | — | 3.0 | 85.0 | 92/8 | 82/18 |
| P-8 | 12.0 | — | — | — | — | — | — | 3.0 | 85.0 | 100/0 | 82/18 |
| P-9 | — | — | — | 12.0 | — | — | — | 3.0 | 85.0 | 0/100 | 82/18 |
| P-10 | 11.0 | — | — | 1.0 | — | — | — | 3.0 | 85.0 | 92/8 | 82/18 |

A discharge electrode paste was prepared in such a manner that about 40% by weight of a Cu powder with an average particle size D50 of 1 μm, about 40% by weight of a Cu powder with an average particle size D50 of 3 μm, and about 20% by weight of an organic vehicle prepared by dissolving ethylcellulose in terpineol were mixed together, followed by dispersion using a triple roll.

In order to prepare a burnout layer burned into a cavity during firing, a resin bead paste was prepared. The resin bead paste for burnout layers was prepared in such a manner that about 38% by weight of cross-linked acrylic resin beads with an average size D50 of 1 μm and about 62% by weight of an organic vehicle prepared by dissolving ethylcellulose in dihydroterpinyl acetate were mixed together, followed by dispersion using a triple roll.

An outer terminal electrode paste was prepared in such a manner that about 80% by weight of a Cu powder with an average particle size D50 of about 1 μm, about 5% by weight of alkali borosilicate glass frit having a transition point of about 620° C., a softening point of about 720° C., and an average particle size D50 of about 1 μm, and about 15% by weight of an organic vehicle prepared by dissolving ethylcellulose in terpineol were mixed together, followed by dispersion using a triple roll.

As shown in FIG. 3A, an unfired discharge auxiliary electrode 12 with a size of about 150 μm×about 100 μm was formed in such a manner that a discharge auxiliary electrode paste was applied to a principal surface of a first ceramic green sheet 11. The discharge auxiliary electrode paste used was one of Discharge Auxiliary Electrode Pastes P-1 to P-10.

Next, the discharge electrode paste was applied to the principal surface of the first ceramic green sheet 11 so as to partially overlap the unfired discharge auxiliary electrode 12, such that an unfired first discharge electrode 13 and an unfired second discharge electrode 14 were formed as shown in FIG. 3B. On the unfired discharge auxiliary electrode 12, the unfired first discharge electrode 13 and the unfired second discharge electrode faced each other with a gap G of about 20 μm therebetween. Facing portions had a width W of about 100 μm.

Next, as shown in FIG. 3C, an unfired burnout layer 15 with a size of about 140 μm×about 150 μm was formed in such a manner that the resin bead paste for burnout layers was applied so as to cover an opposing gap G between the unfired first discharge electrode 13 and the unfired second discharge electrode 14.

A second ceramic green sheet 16 uncoated with paste was stacked on the principal surface of the first ceramic green sheet 11 that was provided with the unfired discharge auxiliary electrode 12, the unfired first discharge electrode 13, the unfired second discharge electrode 14, and the unfired burnout layer 15, followed by pressure bonding, such that a green sheet laminate shown in FIG. 3D was obtained. The laminate was adjusted so as to have a thickness of about 0.3 mm after firing.

The laminate was cut using a micro-cutter so as to have a planar size of about 1.0 mm×about 0.5 mm after firing. Incidentally, the size shown in FIG. 3B and the outer shape of the first ceramic green sheet 11 or the like shown in FIGS. 3A to 3D correspond to the size and outer shape after this cutting step.

Next, an outer terminal electrode paste was applied to outer surfaces of the green sheet laminate, such that unfired outer terminal electrodes 17 and 18 to be connected to the unfired first discharge electrode 13 and the unfired second discharge electrode 14, respectively, were formed. In this manner, an unfired ESD protection device 19 shown in FIG. 3E was obtained.

An ESD protection device 20 shown in FIG. 3F was obtained by firing. The ESD protection device 20 included an insulating substrate 21 formed by sintering the first and second ceramic green sheets, a sintered first discharge electrode 23, a second discharge electrode 24, a discharge auxiliary electrode 25, and outer terminal electrodes 26 and 27. The burnout layer 15 was burned out, so that the hollow section 22 was formed in the insulating substrate 21.

Figure 4:
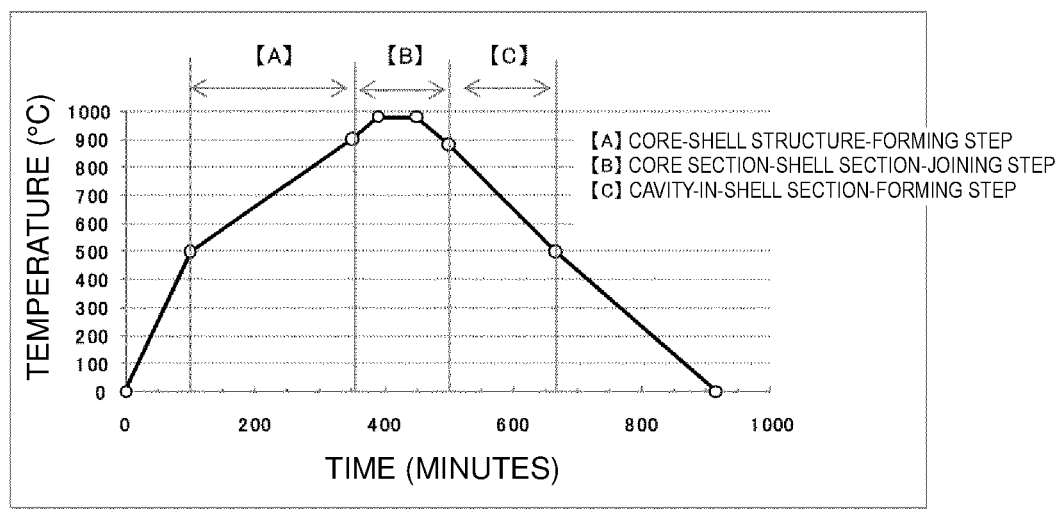
FIG. 4 is an illustration showing an example of a temperature profile in a firing step of a method for manufacturing an ESD protection device according to a preferred embodiment of the present invention.

FIG. 4 shows a temperature profile used during firing. The concentration of oxygen in each step was controlled by varying the ratio of $N_2/H_2/H_2O$ such that Al was oxidized and Cu was not oxidized. The oxygen partial pressure at which each metal is oxidized at a temperature T (K) was calculated using the following inequalities:

$$\ln(Cu_{PO2}) > \{-338904 + (-33T \log T) + 247T\}/(8.314T)$$

$$\ln(Al_{PO2}) > \{-1117993 + (-11T \log T) + 244T\}/(8.314T)$$

ESD protection devices prepared by the above method using Discharge Auxiliary Electrode Pastes P1 to P10 were evaluated for characteristics.

Each ESD protection device was embedded in an epoxy resin, followed by curing. After curing, an LT surface defined by a side extending in a longitudinal direction and a side extending in a thickness direction was exposed by polishing. Incidentally, polishing was performed to one-half of the lateral size. Next, a discharge auxiliary electrode exposed by polishing was subjected to FIB (focused ion beam) milling. The discharge auxiliary electrode sampled by FIB milling was observed with a STEM (scanning transmission electron microscope) and was analyzed for various metals and oxygen using an EDS (energy dispersive X-ray spectrometer). Incidentally, STEM observation was performed at an acceleration voltage of 5 kV with 5,000× magnification and 25,000× magnification. From the STEM observation and EDS analysis, whether metal particles in the discharge auxiliary electrode "are core-shell-structured metal particles each including a shell section made of a metal oxide" or "include a shell section having a cavity" or "whether core-shell-structured metal particles are bound together with a glassy matter-including substance" was judged.

Table 5 shows evaluation results. In the column "Core-shell structure" in Table 5, one in which a shell section made of a metal oxide was observed was shown as "○" and one in which no shell section made of a metal oxide was observed was shown as "X". Incidentally, for one in which no shell was confirmed in this evaluation, any shell section was not analyzed from then on.

In at least two or more metal particles in a field of view by STEM observation, one in which a cavity was observed in a shell section was shown as "○" and one in which no cavity was observed in a shell section was shown as "X".

Furthermore, for those in which a shell section made of a metal oxide was observed, the type of the metal oxide was analyzed and the thickness of the shell section was calculated from image analysis. These results are also shown in Table 5.

Furthermore, whether multiple metal particles in each discharge auxiliary electrode were bound together with a glassy matter-including substance was investigated. That is, a junction present between a specific metal particle and another metal particle adjacent thereto was analyzed with an electron beam diffractometer and the case where no electron beam diffraction pattern was observed was judged to be such that these metal particles were bound together with a glassy matter-including substance. In the column "Bondability to glassy matter-including substance" in Table 5, one in which metal particles were judged to be bound together with a glassy matter-including substance was shown as "○" and one in which metal particles were judged to be not bound together was shown as "X".

Each ESD protection device was measured for insulating resistance in such a manner that a direct-current voltage of about 50 V was applied between outer terminal electrodes of the ESD protection device. One exhibiting an insulating resistance of about $10^8 \Omega$ or more was judged to have good initial shorting characteristics and was shown as "○" in the column "Initial shorting" in Table 5. One exhibiting an insulating resistance of less than about $10^8 \Omega$ was judged to have poor initial shorting characteristics and was shown as "X" in this column. Incidentally, an ESD protection device judged to have poor initial shorting characteristics was judged unsuitable for practical use and was not evaluated for characteristics (shorting resistance and 2 kV discharge rate) from then on.

To each ESD protection device, 0.2 kV was applied 10 times, 0.4 kV was applied 10 times, 0.6 kV was applied 10 times, 1 kV was applied 10 times, 2 kV was applied 10 times, and 4 kV was applied 10 times in that order. The ESD protection device was measured for insulating resistance for each application. A sample in which a resistance of less than about $10^8 \Omega$ was never measured was judged to have the best shorting resistance and was shown as "⊙" in the column "Shorting resistance" in Table 5. A sample in which a resistance of about $10^6 \Omega$ to about $10^8 \Omega$ was measured even once was judged to have better shorting resistance and was shown as "○" in this column. A sample in which a resistance of less than $10^8\Omega$ was measured even once was judged to have poor shorting resistance and was shown as "X" in this column.

The operation rate at 2 kV was evaluated by a contact discharge method on the basis of the standard IEC 61000-4-2 set out by the International Electrotechnical Commission (IEC). The peak voltage ($V_{peak}$) was measured by applying a voltage of 2 kV between outer terminal electrodes of each ESD protection device. When $V_{peak} \leq 500$ V, discharge was judged to occur between the discharge electrodes, that is, the ESD protection device was judged to operate. This operation was performed for 100 ESD protection devices per example and the proportion of ESD protection devices in which discharge occurred among the 100 ESD protection devices was defined as the operation rate (%) at about 2 kV. Those exhibiting an operation rate of about 80% or more at about 2 kV were judged to have the best discharge characteristics and were shown as "⊙" in the column "2 kV operation rate" in Table 5. Those exhibiting an operation rate of about 70% to less than about 80% at about 2 kV were judged to have excellent discharge characteristics and were shown as "○" in this column. Those exhibiting an operation rate of less than about 70% were judged to have poor discharge characteristics and were shown as "X" in this column.

A reliability test was performed by a procedure described below. The resistance IR between outer terminal electrodes of an ESD protection device was measured in such a manner that a voltage of about 12.6 V was applied between the outer terminal electrodes of the ESD protection device for about 65 hours under about 125° C. temperature conditions. The IR measurement was performed for n=20 ESD protection devices. Those in which the average was log IR<6 were rated not problematic with reliability and were shown as "○" in Table 5. Those in which the average was log IR<6 were rated problematic with reliability and were shown as "X" in Table 5.

Among samples rated "○" for "initial shorting" and "shorting resistance" in the evaluation of "initial shorting", "shorting resistance", "2 kV discharge characteristics", and "reliability", a sample rated "⊙" for both "shorting resistance" and "2 kV discharge characteristics" was shown as "⊙" in the column "Overall rating" in Table 5 and a sample rated "⊙" for one of "shorting resistance" and "2 kV discharge characteristics" and rated "○" for the other was shown as "○" in this column. A sample rated "X" in the evaluation of at least one of "initial shorting", "shorting resistance", "2 kV discharge characteristics", and "reliability" was shown as "X" in this column.

TABLE 5

| | First metal particles | | | | Second metal particles | | | |
| --- | --- | --- | --- | --- | --- | --- | --- | --- |
| Device number (Paste number) | Core-shell structure | Presence or absence of cavity in shell section | Type of metal oxide in shell section | Thickness of shell section (nm) | Core-shell structure | Presence or absence of cavity in shell section | Type of metal oxide in shell section | Thickness of shell section (nm) |
| 1 (P-1) | ○ | ○ | $Al_2O_3$ | 80-750 | ○ | X | $Al_2O_3$ | 1-25 |
| 2 (P-2) | ○ | ○ | $Al_2O_3$ | 80-750 | ○ | X | $Al_2O_3$ | 1-25 |
| 3 (P-3) | ○ | ○ | $Al_2O_3$ | 80-750 | ○ | X | $Al_2O_3$ | 26-50 |
| 4 (P-4) | ○ | ○ | $Al_2O_3$ | 80-750 | ○ | X | $Al_2O_3$ | 26-50 |
| 5 (P-5) | ○ | ○ | $Al_2O_3$ | 80-750 | ○ | X | $Al_2O_3$ | 50-75 |
| 6 (P-6) | ○ | ○ | $Al_2O_3$ | 50-550 | ○ | X | $Al_2O_3$ | 1-25 |
| 7 (P-7) | ○ | ○ | $Al_2O_3$ | 100-1500 | ○ | X | $Al_2O_3$ | 1-25 |
| 8 (P-8) | ○ | ○ | $Al_2O_3$ | 80-750 | — | — | — | — |
| 9 (P-9) | — | — | — | — | ○ | X | $Al_2O_3$ | 1-25 |
| 10 (P-10) | ○ | ○ | $Al_2O_3$ | 80-750 | X | — | — | 0 |

| Device number (Paste number) | Presence or absence of bondability to glassy matter-including substance | Initial shorting | Shorting resistance | 2 kV operation rate | Reliability | Overall rating |
| --- | --- | --- | --- | --- | --- | --- |
| 1 (P-1) | ○ | ○ | ⊙ | ⊙ | ○ | ⊙ |
| 2 (P-2) | ○ | ○ | ⊙ | ⊙ | ○ | ⊙ |
| 3 (P-3) | ○ | ○ | ⊙ | ⊙ | ○ | ⊙ |
| 4 (P-4) | ○ | ○ | ⊙ | ⊙ | ○ | ⊙ |
| 5 (P-5) | ○ | ○ | ⊙ | ○ | ○ | ○ |
| 6 (P-6) | ○ | ○ | ○ | ⊙ | ○ | ○ |
| 7 (P-7) | ○ | ○ | ⊙ | ○ | ○ | ○ |
| 8 (P-8) | ○ | ○ | ⊙ | X | ○ | X |
| 9 (P-9) | ○ | X | X | X | X | X |
| 10 (P-10) | ○ | ○ | X | ⊙ | X | X |

ESD Protection Devices 1 to 7 had excellent ESD protection characteristics (initial shorting characteristics, shorting resistance, 2 kV operation rate, and reliability). However, ESD Protection Device 8, which included a discharge auxiliary electrode including no second metal particles, had poor 2 kV operation rate. ESD Protection Device 9, which included a discharge auxiliary electrode including no first metal particles, had reduced insulating properties and suffered shorting. ESD Protection Device 10, which included second metal particles including no shell section, had reduced insulating properties, shorting resistance, and reliability, though discharge could be confirmed at 2 kV.

Preferred embodiments of the present disclosure can be widely applied to the field of ESD protection devices used to protect various apparatuses and devices such as semiconductor devices.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An ESD protection device comprising:
a first discharge electrode;
a second discharge electrode; and
a discharge auxiliary electrode that is electrically connected to the first discharge electrode and the second discharge electrode; wherein
the first discharge electrode and the second discharge electrode are located on or in an insulating substrate so as to at least partially face each other;
the discharge auxiliary electrode includes first metal particles, second metal particles, and a binding agent;
the first metal particles include a core-shell structure including a core section mainly including a first metal and a shell section which mainly includes an oxide of a second metal and which includes at least one portion with a cavity; and
the second metal particles include a core-shell structure including a core section mainly including the first metal and a shell section which mainly includes the oxide of the second metal and which has no cavity.

2. The ESD protection device according to claim 1, wherein the shell section of each of the first metal particles has a thickness of about 50 nm to about 1,500 nm.

3. The ESD protection device according to claim 1, wherein the shell section of each of the second metal particles has a thickness of about 1 nm to less than about 50 nm.

4. The ESD protection device according to claim 1, wherein the binding agent is a glassy matter-including substance.

5. The ESD protection device according to claim 1, wherein the second metal is more oxidizable than the first metal.

6. The ESD protection device according to claim 1, wherein the first metal is copper or a copper-based alloy mainly including copper.

7. The ESD protection device according to claim 1, wherein the oxide of the second metal is at least one selected from the group consisting of aluminum oxide, silicon oxide, magnesium oxide, and nickel oxide.

8. The ESD protection device according to claim 1, wherein the core sections include the second metal in the form of a minor component.

9. The ESD protection device according to claim 1, wherein a content of the second metal particles with respect to all the metal particles included in the discharge auxiliary electrode is about 2% by volume to about 35% by volume.

10. The ESD protection device according to claim 1, further comprising a first outer terminal electrode and a second outer terminal electrode electrically connected to the first discharge electrode and the second discharge electrode, respectively; wherein
the insulating substrate includes a hollow section therein, the first discharge electrode and the second discharge electrode are located so as to at least partially face each other with the hollow section therebetween, and the discharge auxiliary electrode is located such that at least one portion of the discharge auxiliary electrode is exposed to the hollow section.

11. A method for manufacturing an ESD protection device including a discharge auxiliary electrode that is electrically connected to a first discharge electrode and a second discharge electrode, the method comprising:
forming the discharge auxiliary electrode using a discharge auxiliary electrode paste including a first metal powder including particles of an alloy of a first metal and a second metal that is more oxidizable than the first metal and a second metal powder including metal particles each including a shell section mainly including an oxide of the second metal and a core section, covered by the shell section, mainly including the first metal;
firing the discharge auxiliary electrode;
moving the second metal to surfaces of the alloy particles; and
oxidizing the moved second metal.

12. The manufacturing method according to claim 11, wherein the second metal powder is produced in such a manner that metal particles mainly including the first metal are coated with the oxide of the second metal by a mechanofusion process.

13. The manufacturing method according to claim 11, wherein the first metal powder is produced by an atomizing process.

14. The manufacturing method according to claim 11, wherein
the ESD protection device includes an insulating substrate;
the first discharge electrode and the second discharge electrode are located in the insulating substrate so as to at least partially face each other;
multiple ceramic green sheets including a first ceramic green sheet and a second ceramic green sheet are prepared;
the discharge auxiliary electrode, the first discharge electrode, and the second discharge electrode are formed on the first ceramic green sheet;
a burnout layer is formed so as to cover a gap between the first and second discharge electrodes;
the second ceramic green sheet is stacked on the first ceramic green sheet so as to cover the discharge auxiliary electrode, the first discharge electrode, the second discharge electrode, and the burnout layer;
a first outer terminal electrode and a second outer terminal electrode are formed so as to be electrically connected to the first discharge electrode and the second discharge electrode, respectively, after stacking; and
the burnout layer is burned out such that a hollow section is formed in the insulating substrate.

15. The manufacturing method according to claim 11, wherein the shell section of each of the particles of the first metal has a thickness of about 50 nm to about 1,500 nm.

16. The manufacturing method according to claim 11, wherein the shell section of each of the metal particles of the second metal has a thickness of about 1 nm to less than about 50 nm.

17. The manufacturing method according to claim 11, wherein the discharge auxiliary electrode includes first metal particles, second metal particles, and a binding agent.

18. The manufacturing method according to claim 17, wherein the binding agent is a glassy matter-including substance.

19. The manufacturing method according to claim 11, wherein the second metal is more oxidizable than the first metal.

20. The manufacturing method according to claim 11, wherein a content of the particles of the second metal with respect to all the metal particles included in the discharge auxiliary electrode is about 2% by volume to about 35% by volume.

* * * * *